United States Patent
Kum et al.

(10) Patent No.: US 7,033,737 B2
(45) Date of Patent: Apr. 25, 2006

(54) MANUFACTURING METHOD OF ELECTROLUMINESCENT DEVICE

(75) Inventors: Kyo Joo Kum, Yangsan (KR); Jung Ku Lim, Ulsan (KR)

(73) Assignee: Samsung SDI Co., Ltd., Suwon-si (KR)

( * ) Notice: Subject to any disclaimer, the term of this patent is extended or adjusted under 35 U.S.C. 154(b) by 208 days.

(21) Appl. No.: 10/629,769

(22) Filed: Jul. 30, 2003

(65) Prior Publication Data
US 2004/0022932 A1  Feb. 5, 2004

(30) Foreign Application Priority Data
Jul. 31, 2002  (KR) ................ 10-2002-0045281

(51) Int. Cl.
*H01J 9/227* (2006.01)
(52) U.S. Cl. .............. 430/321; 430/319; 430/396; 445/24
(58) Field of Classification Search ............ 430/321, 430/319, 396; 445/24; 313/500, 504, 506, 313/509
See application file for complete search history.

(56) References Cited

U.S. PATENT DOCUMENTS

| | | | |
|---|---|---|---|
| 5,701,055 A | 12/1997 | Nagayama et al. | |
| 2002/0021089 A1* | 2/2002 | Kim | 313/506 |
| 2003/0052596 A1* | 3/2003 | Yi et al. | 313/504 |

FOREIGN PATENT DOCUMENTS

JP  10-241859  9/1998

\* cited by examiner

*Primary Examiner*—John A. McPherson
(74) *Attorney, Agent, or Firm*—Stein, McEwen & Bui, LLP

(57) ABSTRACT

A method of manufacturing an electroluminescent display (EL) device including forming a first electrode unit arranged in a first predetermined pattern on a substrate, simultaneously forming two or more insulating layers covering the substrate and at least portions of the first electrode unit and defining a light emitting area having a second predetermined pattern, the insulating layers having different heights and patterns, forming an electroluminescent (EL) layer on the light-emitting area, forming a second electrode unit in a third predetermined pattern on the light emitting area, and sealing the substrate.

15 Claims, 16 Drawing Sheets

MANUFACTURING METHOD OF ELECTROLUMINESCENT DEVICE

CROSS-REFERENCE TO RELATED APPLICATIONS

This application claims the benefit of Korean Application No. 2002-45281, filed Jul. 31, 2002, in the Korean Intellectual Property Office, the disclosure of which is incorporated herein by reference.

BACKGROUND OF THE INVENTION

1. Field of the Invention

The present invention relates to an electroluminescent (EL) device, and, more particularly, to a method of manufacturing an EL device which can simultaneously form various types of insulating layers on a substrate and on at least some portions of a first electrode.

2. Description of the Related Art

EL devices are self-emission type display devices, and much attention has recently been paid to the EL devices because they have advantageous features suitable for next generation devices, such as a wide viewing angle, a high contrast ratio, and a high response speed. EL devices are classified into inorganic EL devices and organic EL devices, according to the materials used in forming emission layers.

In particular, many studies of organic EL devices have been carried out because of their numerous advantages, including good characteristics in terms of brightness, response speed, color displaying, and so on.

An EL device is basically configured such that an anode is formed on a transparent insulating substrate, e.g., a glass substrate, in a predetermined pattern, a light emission layer consisting of organic or inorganic layers is formed on the anode, and a cathode having a predetermined pattern is then stacked thereon so as to be orthogonal with the anode.

The organic or inorganic layers have at least a light emission layer. As described above, the light emission layer is made of either an organic or inorganic material.

Usable materials of the organic layer include copper phthalocyanine (CuPc), N,N'-di(naphthalene-1-yl)- N,N'-diphenyl-benzidine (NPB), and tris-8-hydroxyquinoline aluminum (Alq3).

In the above-described EL device, when a drive voltage is applied to the anode and the cathode, holes from the anode migrate to the light emission layer, and electrons from the cathode migrate to the light emission layer. The holes and the electrons are recombined in the light emission layer to generate excitons. As the excitons are deactivated to a ground state, fluorescent molecules of the light emission layer emit light, thereby forming an image.

As described above, EL devices are classified into organic EL devices and inorganic EL devices according the materials used for light emission layers. An explanation will now be given by referring to an organic EL device.

In an organic EL device, an anode formed on the top surface of a substrate in a predetermined pattern is a transparent electrode, e.g., indium tin oxide (ITO), which is ordinarily formed by photolithography. Organic layers are formed on the anode by vacuum deposition and a cathode is then patterned thereon.

In the organic EL device having the above-described configuration, a high degree of precision is required in patterning the light emission layer of the organic layers, and patterning a cathode corresponding to an anode, and a variety of techniques have been proposed.

One of the typical methods of forming a cathode having a predetermined pattern is photolithography. If the cathode is formed by photolithography, however, there is a problem in that when the cathode is selectively etched using a photoresist, and the photoresist is stripped off or development is carried out, moisture may soak into an interface between organic layers and the cathode, resulting in degradation in electroluminescent performance due to the deteriorated characteristics of the organic layer, a low luminous efficiency, and a shortened life due to stripping of the cathode.

For overcoming those problems arising due to the entry of moisture, a new method using vacuum deposition, in which a deposition mask is employed, has been utilized to form organic layers or cathodes. However, it is quite difficult to form fine patterns on a large substrate using a deposition mask.

Recently known methods for solving the above-described problems include vacuum deposition using a cathode separator as disclosed in U.S. Pat. No. 5,701,055. According to this method using the shade of a separator, however, highly accurate patterning and high-speed deposition cannot be achieved under the conditions of variable deposition rates and a large amount of material deposited. Also, since portions where cathodes are not formed corresponding to the shade exist in organic layers, these portions are susceptible to ingress of moisture, resulting in deterioration of the organic layers. The deterioration of the organic layers may cause a short-circuit between the anodes and the cathodes.

In another method of forming cathodes, patterned cathodes are directly formed using a deposition mask. This method also has many problems. For example, the thin slit-shaped deposition mask may experience a sag of its central portion in a larger substrate, causing damage to organic layers or cathodes, thereby adversely affecting the yield. The sag also makes it impossible to form cathodes having finer patterns.

A known technique to solve the sag problem of a deposition mask includes disposing a magnetic medium at the opposite side of the deposition mask and closely contacting the deposition mask with an organic layer. However, close contact of the deposition mask may cause the organic layer to be damaged, resulting in a short-circuit between an anode and a cathode.

In order to prevent the damage of an organic layer due to a deposition mask, Japanese Patent Laid-Open Publication No. hei 10-241859 discloses an organic electroluminescent device having shielding walls with a predetermined height formed between the respective lines of an anode. However, according to this method, a gap between the anode and each of the shielding walls makes the organic layer formed at the edge of the anode thinner. Resultantly, the cathode may contact the anode at a lateral portion of the anode, causing a short-circuit between the cathode and the anode.

To prevent a short-circuit between electrodes, it is necessary to insulate non-pixel portions from each other. Also, in order to prevent organic layers from being damaged by a deposition mask, formation of insulating walls is necessary.

Separately, it is also necessary to form shielding walls for preventing an adhesive agent from infiltrating into the device. The adhesive agent is used during sealing of the device using a metal cap, which is performed after completing all film forming steps. The shielding walls should be formed outside the sealed portion of the device, as well as inside the device, as it is also sealed with the adhesive agent to prevent external terminals to be connected with a PCB from being contaminated.

Also, sealing portions for preventing moisture from infiltrating into the device through electrodes extending outward through the sealing portions should be formed using an insulating material having good moisture resistance.

To form such insulating members, photolithography can be employed, including coating a photosensitive resin material, exposing, and developing. However, in the case of using photolithography for forming the insulating members, different steps for forming insulating members having different heights should be separately performed, increasing the total number of processing steps and lowering processing efficiency and manufacturability.

SUMMARY OF THE INVENTION

The present invention provides a method of manufacturing an electroluminescent (EL) device which can prevent layers from being damaged due to a deposition mask, can prevent a short-circuit between a first electrode and a second electrode, and can prevent deterioration of organic layer characteristics due to non-uniformity in coated thickness of organic layers by forming insulating walls when forming an electroluminescent layer or a cathode using a deposition mask.

Also, the present invention provides a method of manufacturing an EL device with a simplified structure, which can prevent contamination of the device due to spreading of an adhesive agent, and can prevent connection inferiority between a flexible PCB and electrode terminals and corrosion of exposed electrode terminals.

Further, the present invention provides a method of manufacturing an EL device with a simplified structure which can prevent moisture from infiltrating into the device through electrode terminals, and can remove moisture remaining in layers.

The present invention also provides a method of manufacturing an EL device which can simultaneously form insulating layers having different patterns and heights by using a single photo mask.

In an aspect of the present invention, there is provided a method of manufacturing an electroluminescent display (EL) device comprising forming a first electrode unit arranged in a first predetermined pattern on a substrate, simultaneously forming two or more insulating layers covering the substrate and at least portions of the first electrode unit and defining a light emitting area having a second predetermined pattern, the insulating layers having different heights and patterns, forming an electroluminescent (EL) layer on the light-emitting area, forming a second electrode unit in a third predetermined pattern on the light emitting area, and sealing the substrate.

The simultaneously forming of two or more insulating layers comprises coating a photosensitive layer having a predetermined height on the substrate and the first electrode unit, exposing the photosensitive layer using a patterned single mask, and developing the exposed photosensitive layer, wherein the patterned single mask exposes portions of the two or more insulating layers and the patterns make intensities of two more portions of the photosensitive layers uniform.

The patterned mask may include two or more patterning portions transmitting different amounts of light.

Also, the patterned mask includes a first patterning portion shielding or transmitting a total amount of light irradiated, and a second patterning portion having a plurality of auxiliary slits diffracting light transmitted through the auxiliary slits.

In this case, the auxiliary slits of the second patterning portion may include one or more portions having different widths, and diffraction is varied by adjusting widths of the auxiliary slits.

Also, the insulating layers formed using the patterned mask may include inter-insulators defining the first electrode unit into the light-emitting area having the second predetermined pattern, insulating walls having a predetermined pattern and each having a height greater than each of the inter-insulators, shielding walls formed on the substrate along an outer periphery of the light-emitting area and preventing entry or escape of an adhesive agent when sealing the substrate, a sealing portion formed along a portion of the substrate sealed and preventing infiltration of moisture when sealing the substrate, and separators defining the second electrode unit in the third predetermined pattern.

In another aspect of the present invention, there is provided a method of manufacturing an electroluminescent display (EL) device comprising forming a first electrode unit arranged in a first predetermined pattern on a substrate, simultaneously forming inter-insulators covering the substrate and at least portions of the first electrode unit and defining a light emitting area having a second predetermined pattern and insulating walls having a third predetermined pattern formed on at least portion of the inter-insulators, wherein the inter-insulators and the insulating walls have different heights; forming an EL layer on the light-emitting area, forming a second electrode unit in a fourth predetermined pattern on the light emitting area, and sealing the substrate.

The forming of the inter-insulators and insulating walls may comprise coating a photosensitive layer having a predetermined height on the substrate and the first electrode unit, exposing the photosensitive layer using a patterned single mask, and developing the exposed photosensitive layer, wherein the patterned single mask includes a first patterning portion and a second patterning portion respectively exposing the inter-insulators and the insulating walls.

The first and second patterning portions may transmit different amounts of light. The first patterning portion may shield or transmit a total amount of light irradiated during the exposing, and the second patterning portion may have a plurality of auxiliary slits diffracting light transmitted through the auxiliary slits.

Preferably, the photosensitive layer may be of a positive type in which exposed portions thereof are removed, the first patterning portion has a first shielding portion along a pattern for forming the insulating walls, and the second patterning portion has a second shielding portion having the plurality of auxiliary slits along a pattern for forming the inter-insulators, wherein the light irradiated into the second shielding portion is diffracted through the plurality of auxiliary slits.

Alternatively, the photosensitive layer may be of a negative type in which non-exposed portions thereof are removed, the first patterning portion has a first shielding portion opened along a pattern for forming the insulating walls, and the second patterning portion has a second shielding portion opened along a pattern for forming the inter-insulators, wherein the opened portion of the second shielding portion has an auxiliary shielding portion having the plurality of auxiliary slits so that the light irradiated into the second shielding potion is diffracted.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the preferred embodiments taken in conjunction with the accompanying drawings in which.

DETAILED DESCRIPTION OF THE PREFERRED EMBODIMENTS

Figure 1:
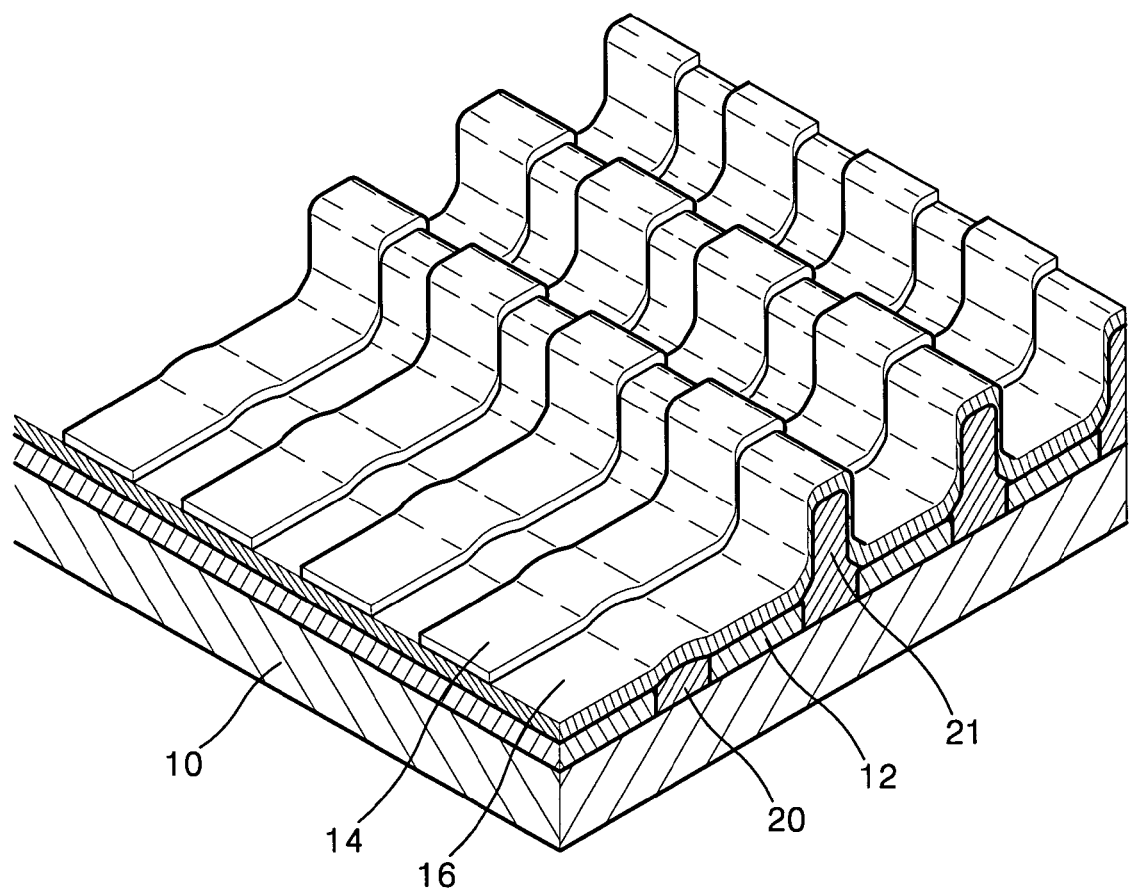
FIG. 1 is a partly cut-away perspective view of an organic EL device according to an embodiment of the present invention.

Reference will now be made in detail to the present preferred embodiments of the present invention, examples of which are illustrated in the accompanying drawings, wherein like reference numerals refer to the like elements throughout. The embodiments are described below in order to explain the present invention by referring to the figures.

The following description of preferred embodiments is directed mainly to the structure of an organic EL device in which organic compounds are used as light emission layers. However, the present invention can be applied in the same manner to an inorganic EL device using inorganic compounds as light emission layers.

As described above, according to an embodiment of the present invention, various insulating layers formed on a substrate and the first electrode, including an inter-insulator, an insulating wall, a shielding wall, a sealing portion, and a separator, are formed by a single process, thereby reducing the number of processing operations.

First, structures of organic EL devices according to various embodiments of the present invention will be described. An organic EL device according to an embodiment of the present invention includes a first electrode unit formed on a substrate, and two or more members selected from an inter-insulator, an insulating wall, a shielding wall, and a sealing portion, the members formed on the substrate and the first electrode unit. In the following examples, organic EL devices having an inter-insulator will be described, but the invention is not limited to these specific embodiments, and any combination of two or more members of the inter-insulator, the insulating wall, the shielding wall, and the shielding portion can be employed.

FIGS. 1 through 8 illustrate structures of an organic EL device according to an embodiment of the present invention, comprising an inter-insulator and an insulating wall.

Referring to the drawings, the organic EL device includes a first electrode unit 12 arranged in a predetermined pattern on a substrate 10 made of a transparent material, and a second electrode unit 14 arranged in a direction crossing the first electrode unit 12. Also, the organic EL device includes an electroluminescent layer, that is, an organic layer 16, where organic electroluminescence occurs by holes and electrons supplied from the first and second electrode units 12 and 14, and a hermetically sealed cap (not shown) forming a predetermined space for protecting the organic layer. Although not shown, a flexible printed circuit board (PCB) connecting various circuits for driving the organic EL device is mounted on the cap, which will also be applied to the following embodiments of the present invention.

In a preferred embodiment of the present invention, the first electrode unit 12 and the second electrode unit 14 may be formed of stripes spaced apart from and parallel to each other, not necessarily limited to this pattern, and any pattern that can form pixels can be employed.

As shown in FIGS. 1 and 4 through 8, the organic EL device having the above-described construction further includes an inter-insulator 20 formed on the transparent substrate 10 and on at least a portion of the first electrode unit 12 in a predetermined pattern to define light-emitting areas, i.e., pixels, and an insulating wall 21 formed in a predetermined pattern so as to be higher than the inter-insulator 20.

The inter-insulator 20 provides for definition of spaces between each of the various electrode lines of the first electrode unit 12, and for insulation between each of the electrode lines of the first electrode unit 12, and may be formed in various patterns according to the arrangement of light emitting areas, i.e., pixels. As shown in FIGS. 4 through 8, the inter-insulator 20 may be formed between each of the respective electrode lines constituting the first electrode unit 12, and on the first electrode unit 12 in a lattice form. Otherwise, the inter-insulator 20 may be patterned in a stripe form so as to be parallel with and disposed between each of the respective electrode lines constituting the first electrode unit 12.

The insulating wall 21 formed where the inter-insulator 20 is formed, that is, formed on at least some portions of the inter-insulator 20, can be made of the same material as that of the inter-insulator 20. The insulating wall 21 is high enough to support a shielding portion of a deposition mask in forming a second electrode or an organic layer for color display. That is to say, as shown in FIGS. 1 through 3, the height of each of the insulating walls 21 should be greater than the sum of the height of the first electrode unit 12 and the height of the organic layer 16, which is for the purpose of protecting organic layers of pixel areas between each of the insulating walls.

Figure 2:
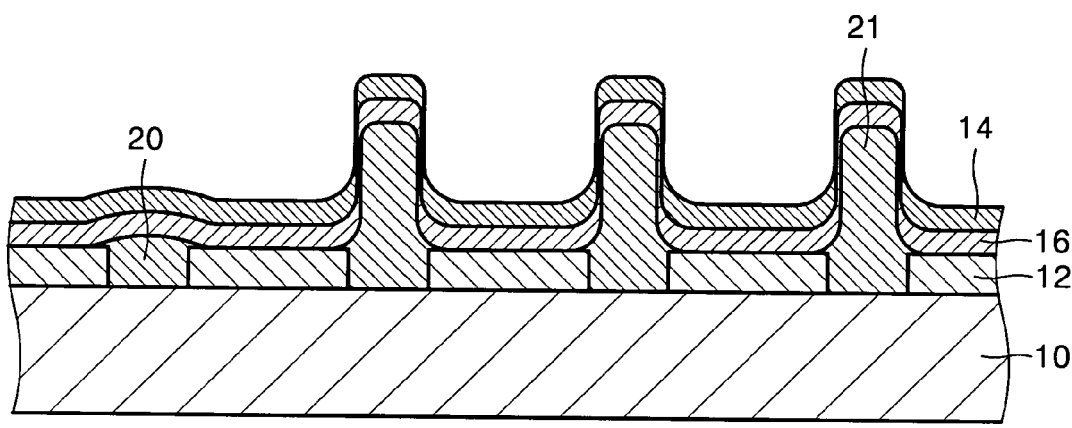
FIG. 2 is a cross-sectional view of the organic EL device shown in FIG. 1.
Figure 3:
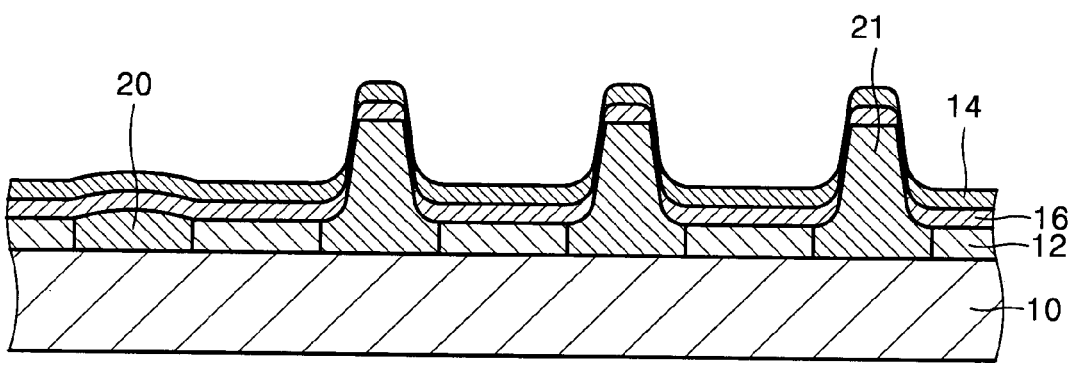
FIG. 3 is a cross-sectional view of another example of the organic EL device shown in FIG. 1.

Since the insulating wall 21 having the above-described constructions is basically formed where the inter-insulator 20 is formed, as shown in FIGS. 2 and 3, spaces between each of the respective electrode lines of the first electrode unit 12 are filled by the insulating wall 21. Thus, no gap between each of the respective electrode lines and the insulating wall 21 is generated when the organic layer 16 and the second electrode unit 14 are formed on the insulating wall 21 and the inter-insulator 20. Rather, the organic layer 16 and the second electrode unit 14 sequentially stacked thereon are gently sloped at the boundary between the insulating wall 21 and the first electrode unit 12. Accordingly, the short-circuit between the first electrode unit 12 and the second electrode unit 14, arising due to thinning of organic layers at the lateral edges of the electrode lines of the first electrode unit 12, can be prevented. Also, as will be described later, even when a second electrode unit or an organic EL layer is deposited using a deposition mask, a shielding portion of the deposition mask is supported by an insulating wall, thereby preventing damage to the organic layer.

As shown in FIG. 2, the cross-section of each insulating wall according to an embodiment of the present invention may be rectangular. The cross-section of each insulating wall may also be trapezoidal, as shown in FIG. 3. Preferably, in order for the organic layer 16 and the second electrode unit 14, deposited on an insulating wall 21', to be gently sloped between the insulating wall 21' and the lateral edges of the first electrode unit 12, the cross-section of each insulating wall 21' is trapezoidal so that the lower surface thereof facing the transparent substrate 10 is wider than the top surface thereof, as shown in FIG. 3.

Figure 4:
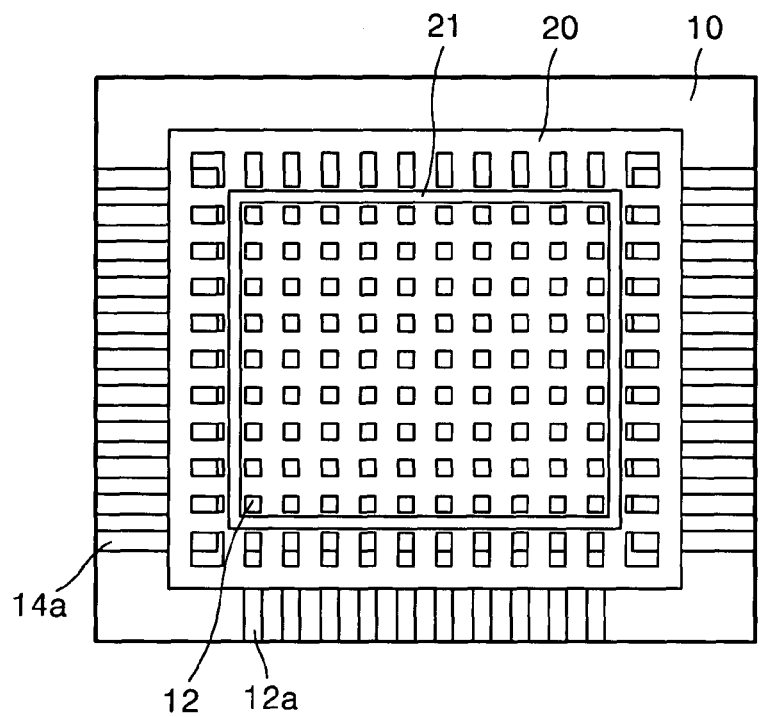
FIGS. 4 through 8 are plan views of an insulating wall having various patterns of the organic EL device shown in FIG. 1.
Figure 5:
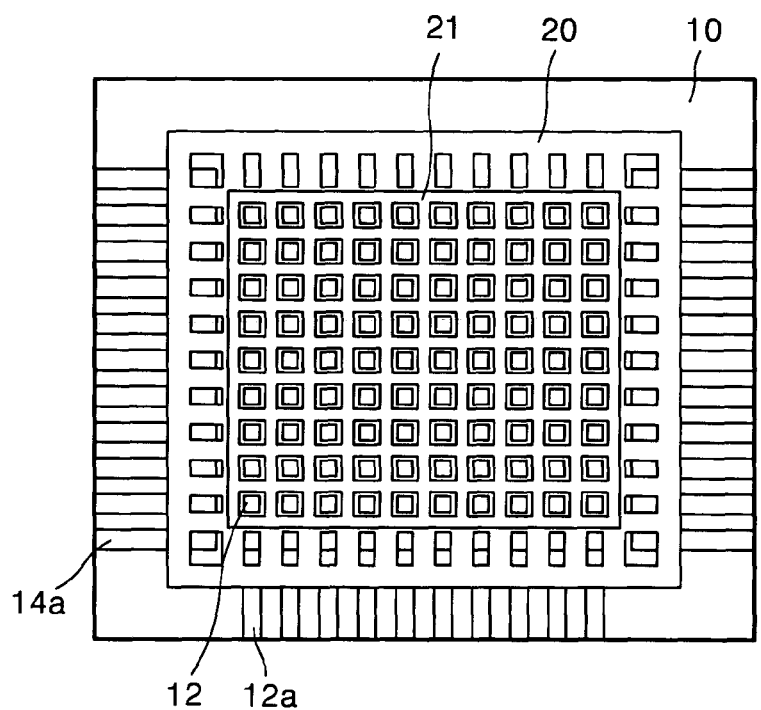
Figure 6:
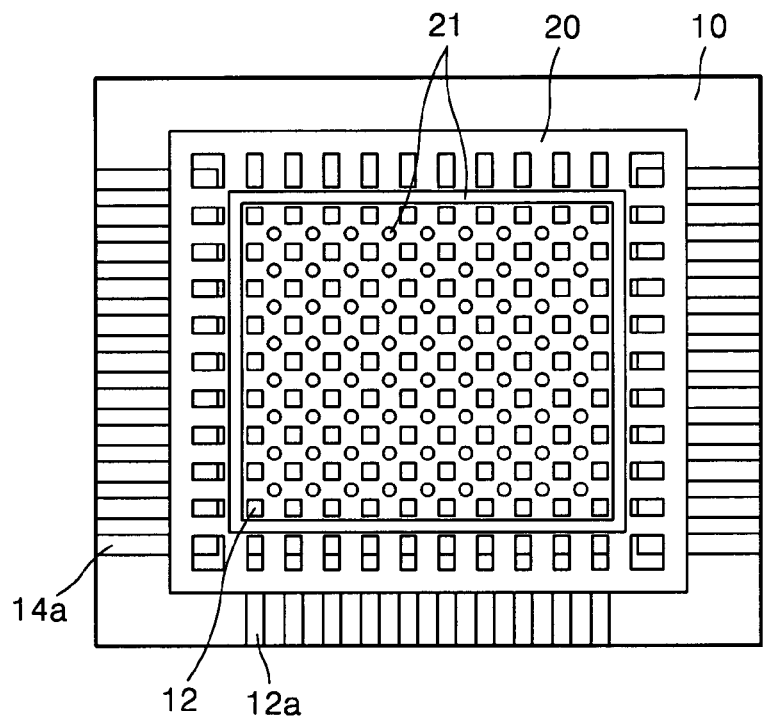
Figure 7:
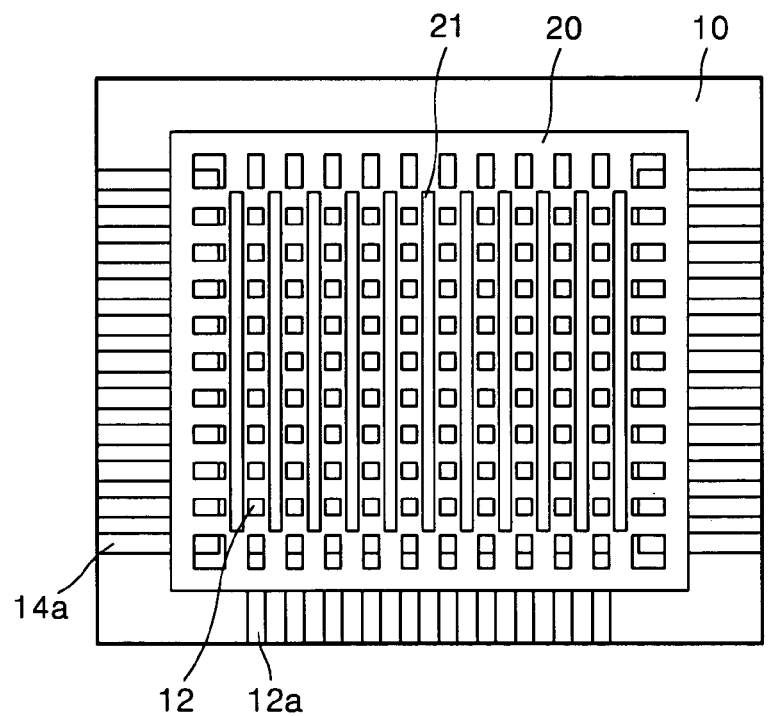
Figure 8:
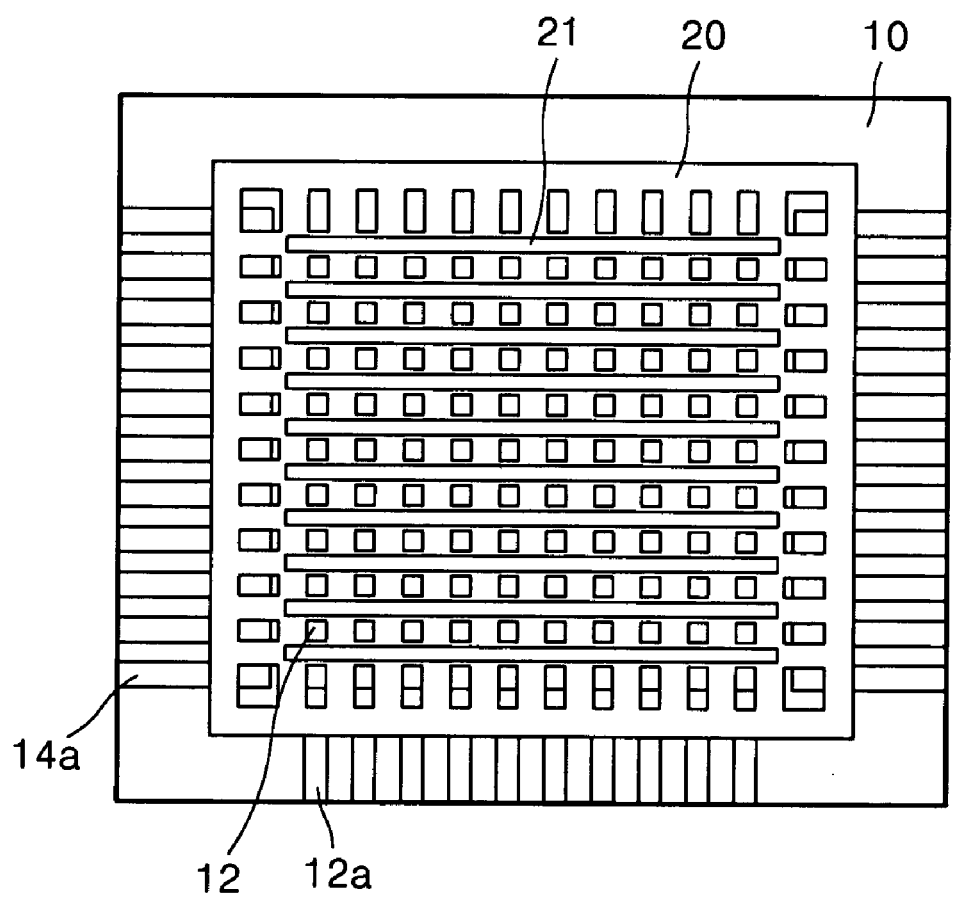

The insulating wall 21 may be formed in various patterns according to the patterns of the inter-insulators 20. For example, when the inter-insulator 20 is formed in a lattice form, the insulating wall 21 can be formed in a closed rectangular line along the periphery of a light emitting area defined by the inter-insulator 20, as shown in FIG. 4. Also, as shown in FIG. 5, the insulating wall 21 can be formed in a lattice pattern along the latticed inter-insulator 20. The insulating wall 21 can also be formed in a dot pattern, as shown in FIG. 6 in which dots are not interconnected. Also, as shown in FIGS. 7 and 8, the insulating wall 21 can be formed in a stripe pattern. In detail, FIG. 7 shows the insulating wall 21 formed parallel to first electrode lines of the first electrode unit 12, and FIG. 8 shows the insulating wall 21 arranged perpendicular to first electrode lines of the first electrode unit 12, that is, parallel to electrode lines constituting a second electrode unit. Here, reference numeral 14a denotes second electrode terminals formed at edges of the substrate 10. The second electrode unit is formed and connected to the electrode terminals.

Such various patterns of the insulating wall 21 can be applied in the same manner to the structure in which the inter-insulator 20 is of a striped pattern parallel to the first electrode unit 12, rather than of a lattice pattern.

As described above, the inter-insulator 20 and the insulating wall 21 having various patterns are easily formed by photolithography, which can be simultaneously formed using a single mask, which will be later described. Also, the inter-insulator 20 and the insulating wall 21 can be formed by using photoresist or photosensitive polyimide.

Figure 9:
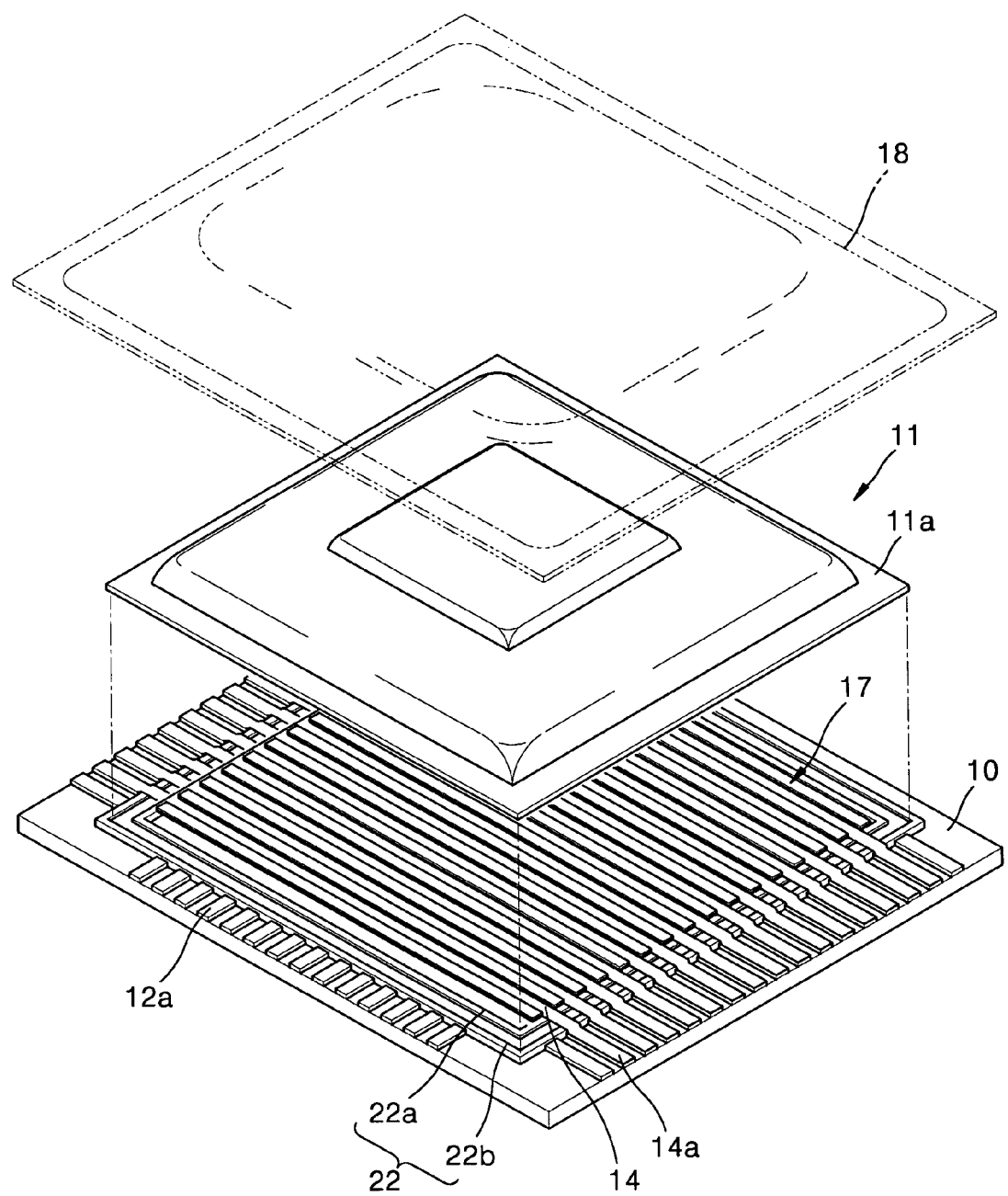
FIG. 9 is a partially exploded perspective view of an organic EL device according to another embodiment of the present invention.

FIG. 9 is a partially exploded perspective view of an organic EL device according to another embodiment of the present invention.

Referring to FIG. 9, the organic EL device includes a transparent substrate 10, an organic EL portion 17, a cap 11, a shielding wall 22, and a flexible PCB 18. The organic EL portion 17 is formed on the substrate 10 and driven by current supplied from first and second electrode terminals 12a and 14a. The cap 11 is adhered to the substrate 10 along the periphery of the organic EL portion 17 to seal the organic EL portion 17, forming a predetermined space, and having an adhesion area 11a adhered to the substrate 10 by an adhesive agent. The shielding wall 22 is formed on at least one portion of the substrate 10 to which the cap is adhered, and prevents spreading of the adhesive agent. The flexible PCB 18 connects circuits (not shown) for driving the first and second electrode terminals 12a and 14a and the organic EL portion 17.

As the adhesive agent used for adhering the substrate 10 to the cap 11, a thermally curable adhesive agent or an UV curable adhesive agent can be used singly or in combination of the two.

The organic EL portion 17 is constituted by a first electrode unit extending from the first electrode terminal 12a in a predetermined pattern, an organic layer formed on the first electrode unit, and a second electrode unit 14 patterned on the organic layer to be substantially perpendicular to the first electrode unit.

Figure 10:
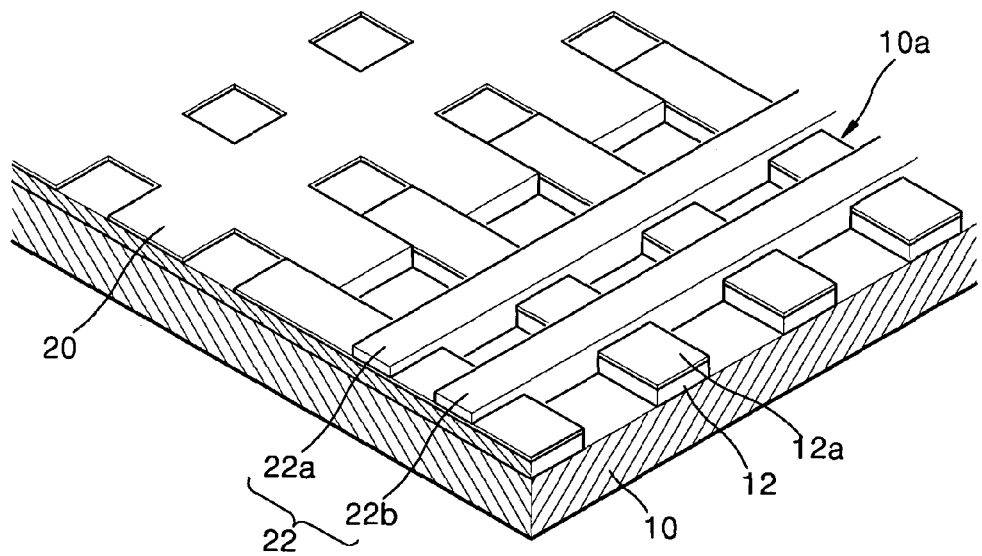
FIG. 10 is a partly cut-away cross-sectional view of the organic EL device shown in FIG. 9.

Although not shown, the organic EL portion 17 has an inter-insulator 20 formed on the first electrode unit and the substrate and defining the first electrode unit in a predetermined pattern, which is the same as shown in FIG. 10. The inter-insulator 20 may be formed in a lattice or stripe pattern. The patterns are the same as those described in the above embodiments, but not limited thereto, and the organic EL portion 17 may have various patterns.

Figure 11:
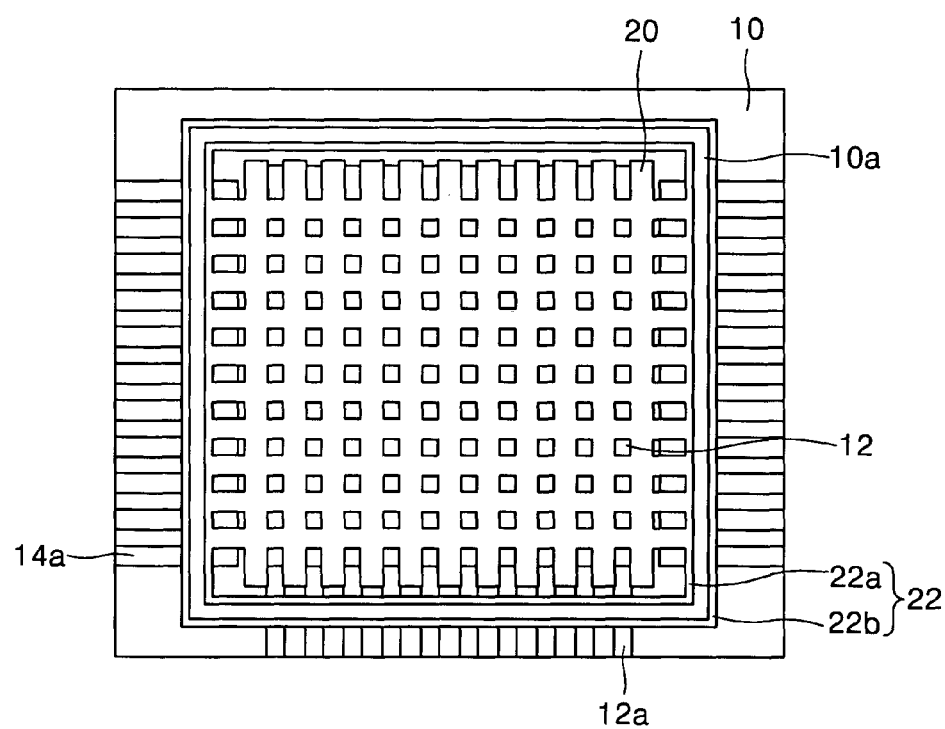
FIG. 11 is a plan view of a shielding wall of the organic EL device shown in FIG. 9.

In the organic EL device, as shown in FIGS. 10 and 11, the shielding wall 22 is formed on both of one portion of inside and outside the adhesion area 10a of the substrate 10. As shown FIG. 11, the shielding wall 22 is formed in closed lines to be adjacent to the adhesion area 10a to which the adhesive agent for adhering a cap to the substrate 10 is to be applied. Here, the shielding wall 22 is preferably formed of the same insulating material as that of an inter-insulator 20, and is preferably simultaneously formed with the formation of the inter-insulator 20. Referring back to FIG. 10, the height of the shielding wall 22 should be greater than the sum of the height of the first electrode terminal 12a extending to an edge of the substrate 10 and the height of the first electrode unit 12.

The shielding wall 22 is formed into portions to which the adhesive agent is to be applied, along the outer periphery of the EL area where the inter-insulator 20 is formed, that is, inside and outside the adhesion area 10a of the substrate 10, as shown in FIGS. 10 and 11. The internal shielding wall 22a prevents internal organic layers from being contaminated due to entry of the adhesive agent into the device. The external shielding wall 22b prevents electrode terminals from rusting at gaps between each of the flexible PCB, the substrate, and the cap, the gaps generated when the flexible PCB is connected to the first and second electrode terminals 12a and 14a formed at the periphery of the device.

Figure 12:
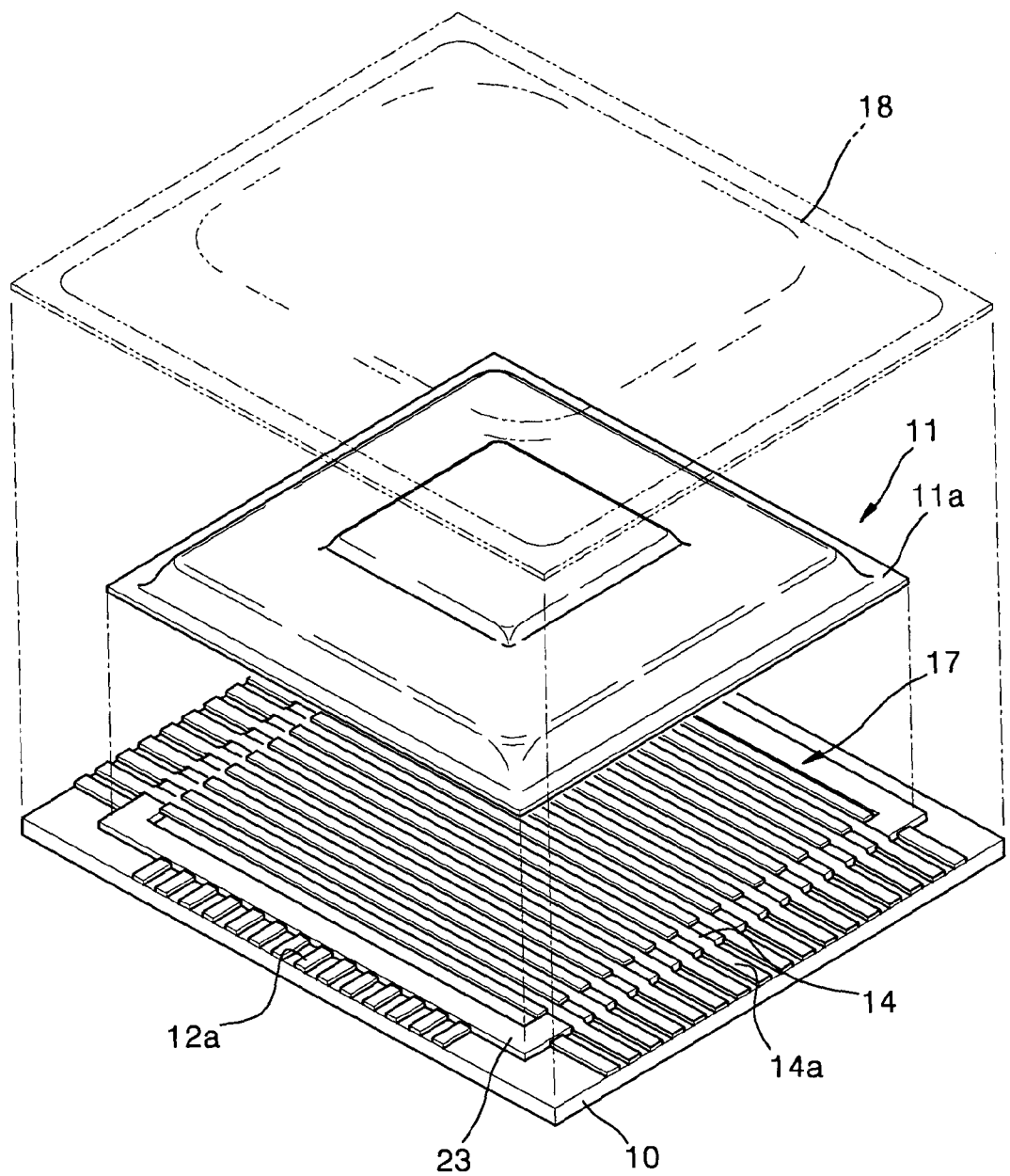
FIG. 12 is a partly cut-away perspective view of an organic EL device according to another embodiment of the present invention.

FIG. 12 is a partly cut-away perspective view of an organic EL device according to another embodiment of the present invention.

Referring to FIG. 12, the organic EL device includes a sealing portion 23 for preventing entry of moisture when sealing a substrate 10 to the adhesion area of a cap 11. The organic EL device according to this embodiment has the same structure as that shown in FIG. 9, except that the sealing portion 23 is further provided, and an explanation thereof will not be given.

As shown in FIG. 12, the sealing portion 23 is formed at a portion where the adhesion area 11a of the cap 11 is adhered to the substrate 10. That is, the sealing portion 23 is formed under the adhesion area 11a at which adhesion between the substrate 10 and the cap 11 occurs, so as to be wider than an adhesive coated area between the cap 11 and the substrate 10. Thus, as shown in the drawing, the sealing portion 23 is formed along an adhered portion where the upper portion of the substrate 10 and electrode terminals 12a and 14 and the cap 11 are adhered to each other. Here, the width of the sealing portion 23 is preferably greater than that of the adhesion area 11a to which the adhesive agent is applied, as shown in FIG. 12, which is for the purpose of preventing the adhesive agent from infiltrating inside or outside the substrate 10. Also, in the case where a flexible PCB 18 is attached to a portion in the vicinity of the outer periphery of the first electrode terminal 12a or the second electrode terminal 14a, the sealing portion 23 is preferably formed wide enough to reach the flexible PCB 18. This is for preventing corrosion of the electrode terminals due to an exposed space between the PCB 18 and the edge of the cap 11 adhered to the PCB 18 after the attaching of the PCB 18.

The height of the sealing portion 23 is preferably greater than that of both the first electrode terminal 12a and the second electrode terminal 14a, extending to the periphery of the substrate 10. This is for the purpose of preventing entry of moisture into the cap 11 sealed along the electrode terminals.

Figure 13:
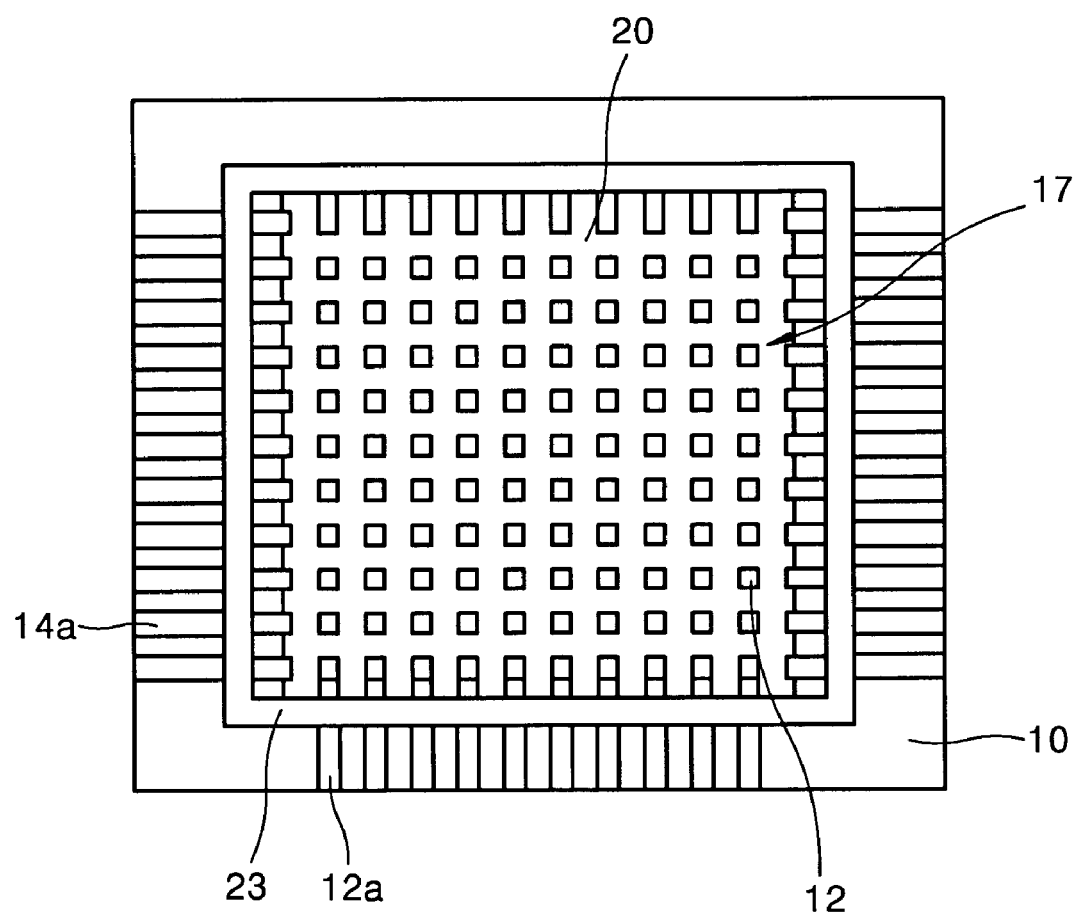
FIGS. 13 and 14 are plan views of shielding portions having various patterns of the organic EL device shown in FIG. 12.
Figure 14:
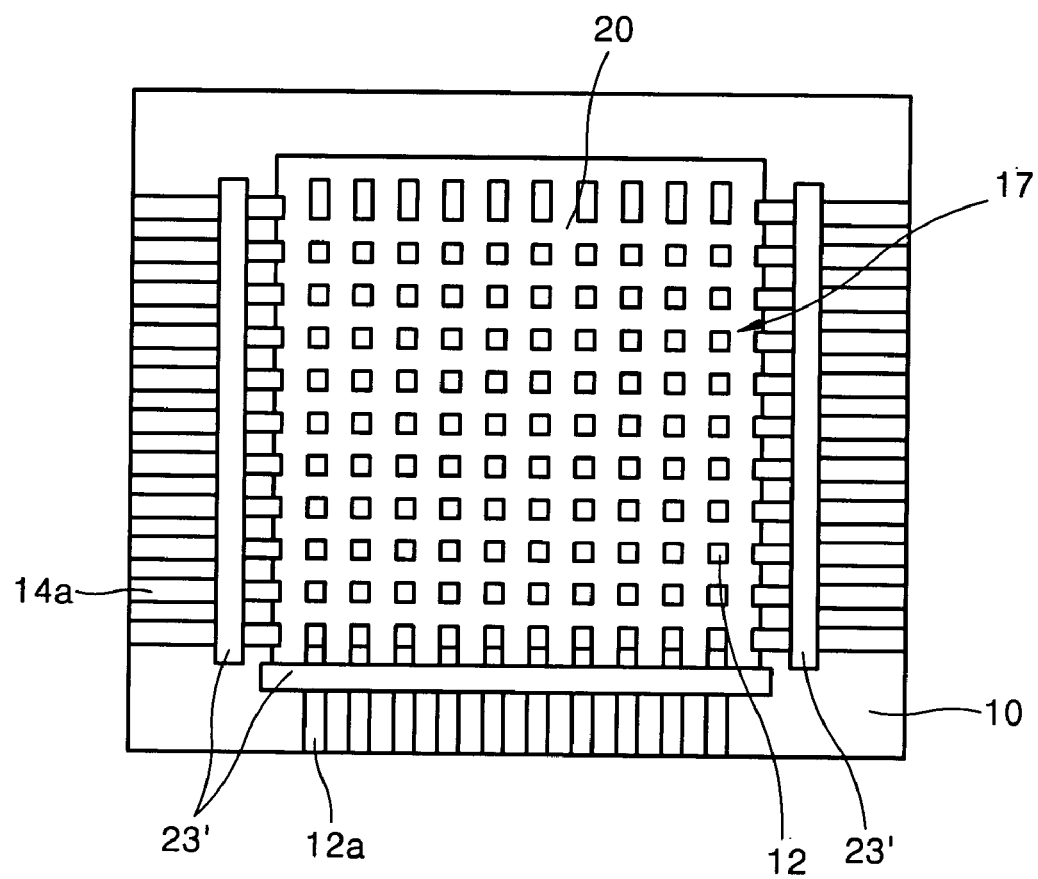

The sealing portion 23 may be formed in various patterns. As shown in FIG. 13, the sealing portion 23 is formed in a closed rectangle corresponding to a coated area to which the adhesive agent is applied. As shown in FIG. 14, sealing portions 23' are formed at portions where the electrode terminals 12a and 14a are formed, so as to be perpendicular to the electrode terminals 12a and 14a, respectively. FIGS. 13 and 14 illustrate that the inter-insulator 20 is arranged in a lattice form, but is not limited thereto.

The sealing portion 23 may be formed of the same insulating material as that used for forming the inter-insulator 20, and by the same manufacturing process. In other words, patterning of the sealing portion 23 can be performed by photolithography simultaneously with patterning of the inter-insulator 20 in the manufacture of the inter-insulator 20. Here, the sealing portion 23 can be formed of photoresist, preferably photosensitive polyimide. In particular, the polyimide has high heat resistance so that it is not decomposed even at 200° C. or higher during drying, thereby reducing the amount of moisture remaining inside the layer.

In the organic EL device according to the manufacturing method of the present invention, an inter-insulator, an insulating wall, a shielding wall and a sealing portion may be formed in a combination type of two or more of these members. The manufacturing method according to an embodiment of the present invention is also applied to the formation of insulating layers prior to deposition of organic layers. For example, the invention can be applied to the formation of a separator defining a second electrode unit as well as to the formation of the above-referenced members.

Next, a method of manufacturing the organic EL device having the above-described configuration will now be described.

Figure 15A:
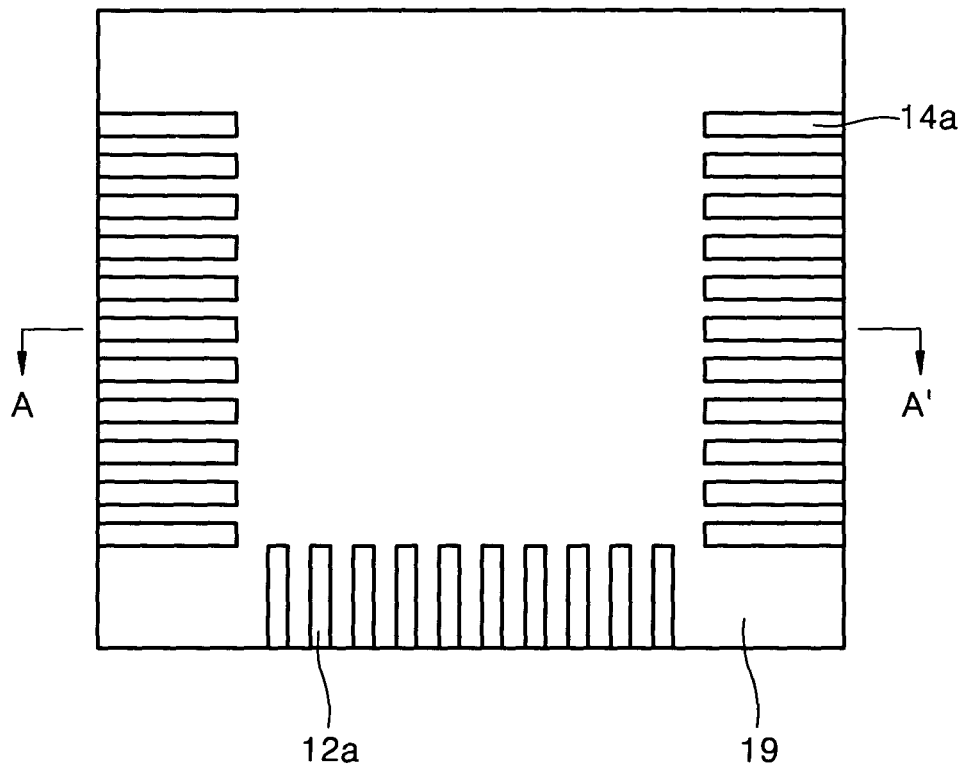
FIGS. 15A through 16B illustrate sequential operations of a method of manufacturing a first electrode of an organic EL device according to an embodiment of the present invention.
Figure 15B:
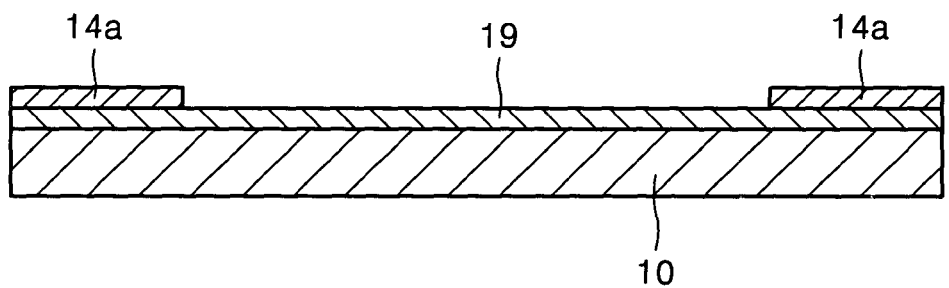
Figure 16A:
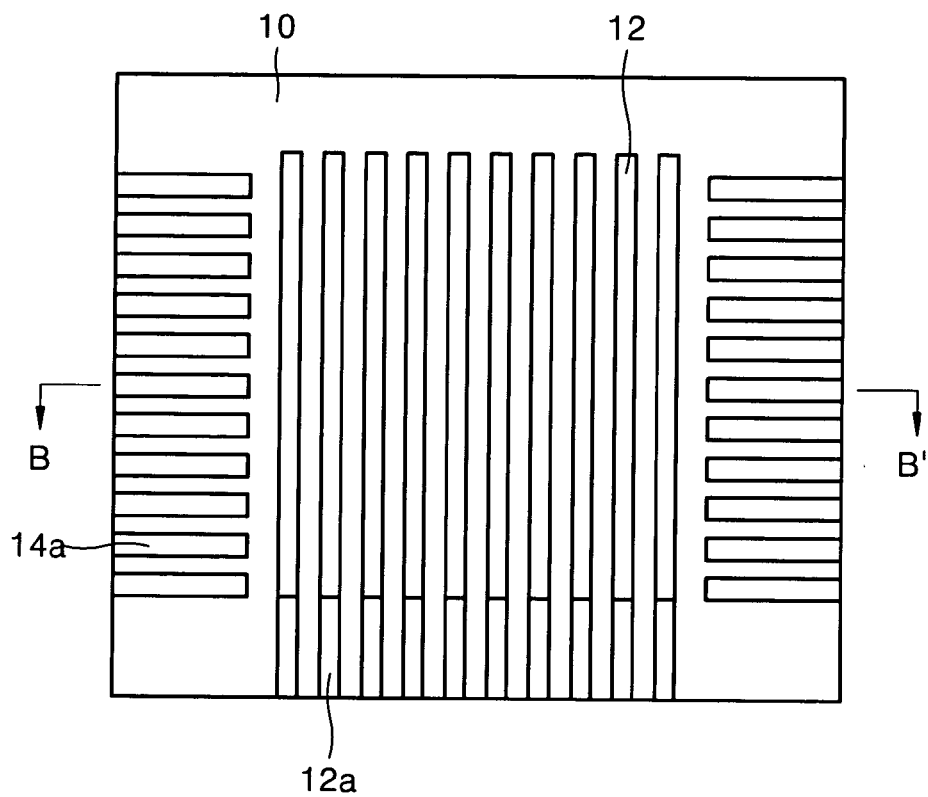
Figure 16B:
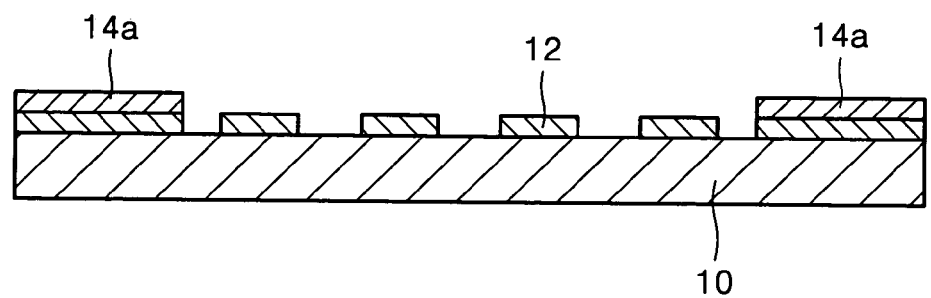

Referring to FIGS. 15A and 15B, a transparent substrate 10 having a transparent conductive layer 19 and a metal conductive layer stacked thereon is first prepared. The metal conductive layer formed on the transparent substrate 10 is processed to form first and second electrode terminals 12a and 14a at the edges of the transparent substrate 10. FIG. 15B is a cross-sectional view of FIG. 15A taken along the line A-A'. If formation of the first and second electrode terminals 12a and 14a is completed in such a manner, the transparent conductive layer 19 exposed to the transparent substrate 10 is processed to form a first electrode unit 12 having a predetermined pattern, electrode lines of which are respectively connected to the first electrode terminals 12a, as shown in FIGS. 16A and 16B. The first and second electrode terminals 12a and 14a and the first electrode unit 12 can be formed using the transparent conductive layer 19 by photolithography, but is not limited thereto, and can be directly formed by deposition. FIG. 16B is a cross-sectional view of FIG. 16A taken along the line B-B'.

Figure 17:
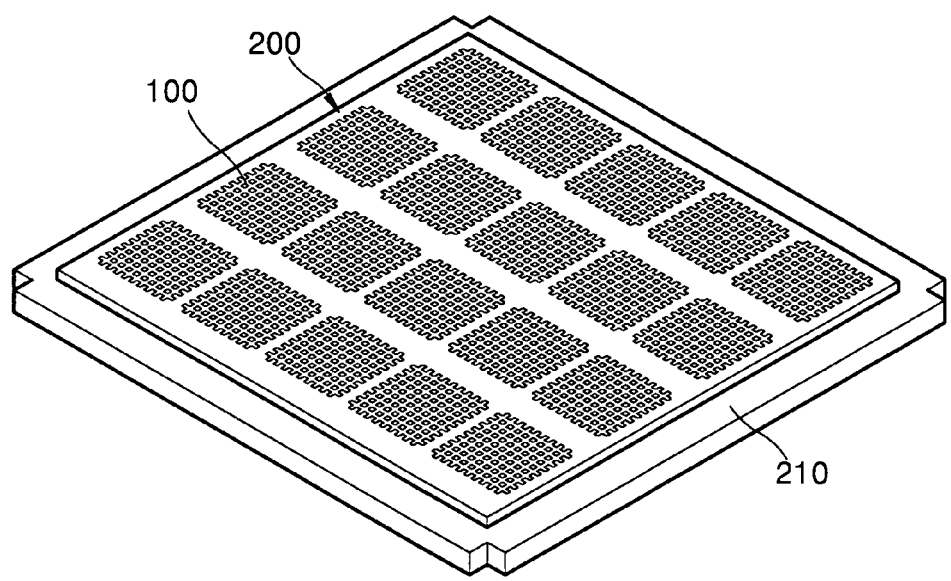
FIG. 17 is a perspective view of an example of a mask that can be used in the manufacturing method according to an embodiment of the present invention.

After forming the first electrode unit 12, at least two or more insulating layers having different patterns and heights, including an inter-insulator, an insulating wall, a shielding wall, a sealing portion and other kinds of insulators, are formed on the substrate and the first electrode unit using a mask shown in FIG. 17 through a single processing operation. According to an embodiment of the present invention, for the sake of convenience in explanation, a method of forming the inter-insulators and the insulating walls among the layers mentioned above using a single mask will be described by way of example, but the invention is not limited thereto.

The mask shown in FIG. 17 is used in simultaneously forming the inter-insulator 20 and the insulating wall 21 shown in FIGS. 1 through 8. The mask is configured such that a mask 200 having a plurality of unit masks 100 is patterned on a mask board 210. Each of the unit masks 100 includes first and second patterning portions having different amounts of light transmitted. As will be described later, the first patterning portion forms an insulating wall, and the second patterning portion forms an inter-insulator. The mask board 210 is formed of transparent glass or quartz. The mask 200 and the unit masks 100 may be patterned using metal, for example, chrome (Cr).

Figure 18:
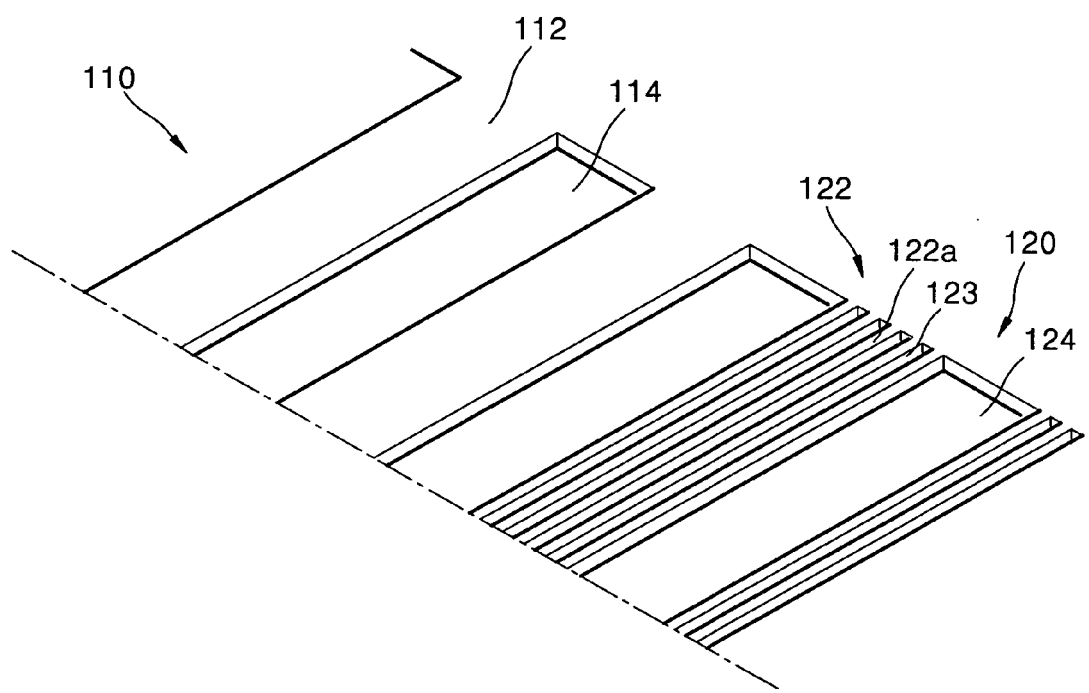
FIG. 18 is a partly cut-away perspective view of the mask shown in FIG. 17.

The first patterning portion 110 forming the unit masks 100 includes a first shielding portion 112 for shielding a total amount of light irradiated during exposure, and a first slit portion 114 for transmitting the total amount of the light between two adjacent first shielding portions, as shown in FIG. 18. The second patterning portion 120 includes a second shielding portion 122 having a plurality of auxiliary slits 123 for diffracting light, and a second slit portion 124 for transmitting the total amount of light between two adjacent second shielding portions. In the case where three or more insulating layers are formed, in order to adjust diffraction of light, the second patterning portion 120 is configured such that the auxiliary slits 123 and auxiliary shielding portions 122a are varied to have two or more widths according to the patterns thereof. Therefore, the amount of light transmitted can be adjusted, thereby simultaneously forming layers having different heights.

The method of simultaneously forming various layers having different heights using a mask having two or more patterning portions will now be described in more detail.

In order to form a layer having a predetermined pattern on a substrate, a photosensitive layer is coated on the substrate, and the resulting photosensitive layer is exposed, using the mask shown in FIGS. 17 and 18, and developed.

According to this method, if parallel light is incident into a mask board, the light is totally transmitted into an area having the first slit portion 114, but is not transmitted to an area having the first shielding portion 112. In particular, patterns interfered by diffraction are formed in the second shielding portion 122 having the plurality of auxiliary slits 123 through which light is transmitted.

Effects of such interference by diffraction can be more concretely explained with reference to FIGS. 19A and 19B.

Figure 19A:
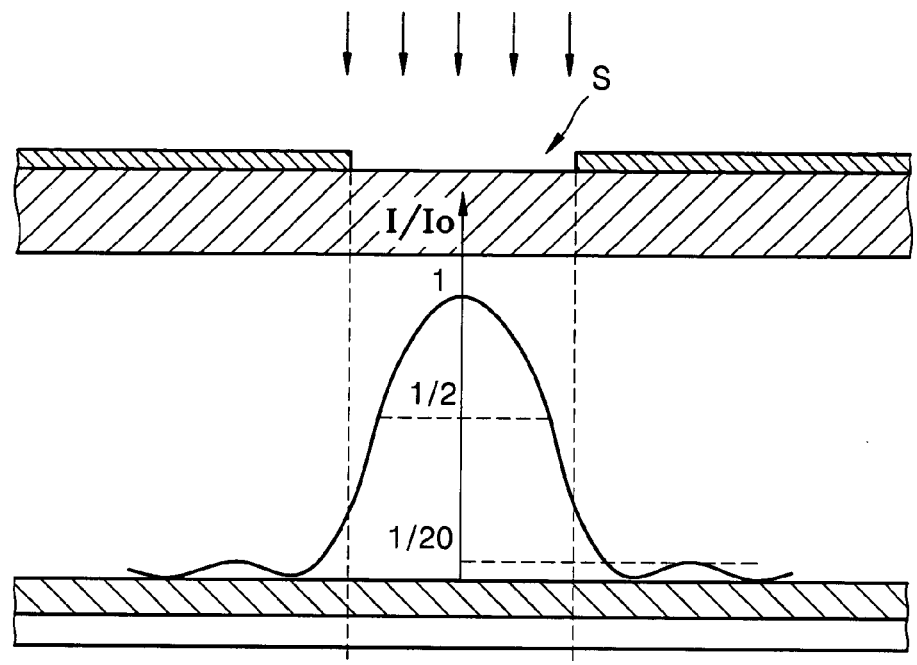
FIGS. 19A through 20 illustrate changes in intensity depending on diffraction.

In the intensity profile of a diffraction pattern resulting when light passes through a slit S, as shown in FIG. 19A, assuming that the intensity of the central maximum is 1, the intensity of the second (1st order) maxima is approximately $\frac{1}{20}$, so that it is not necessary to take the second maxima into consideration in evaluating the effect of interference by diffraction. Further, if the width of the slit S is reduced, the intensity is reduced so as to be inversely proportional to the square of the width of the slit S. Thus, there is even more reason to neglect the second maxima.

Figure 19B:
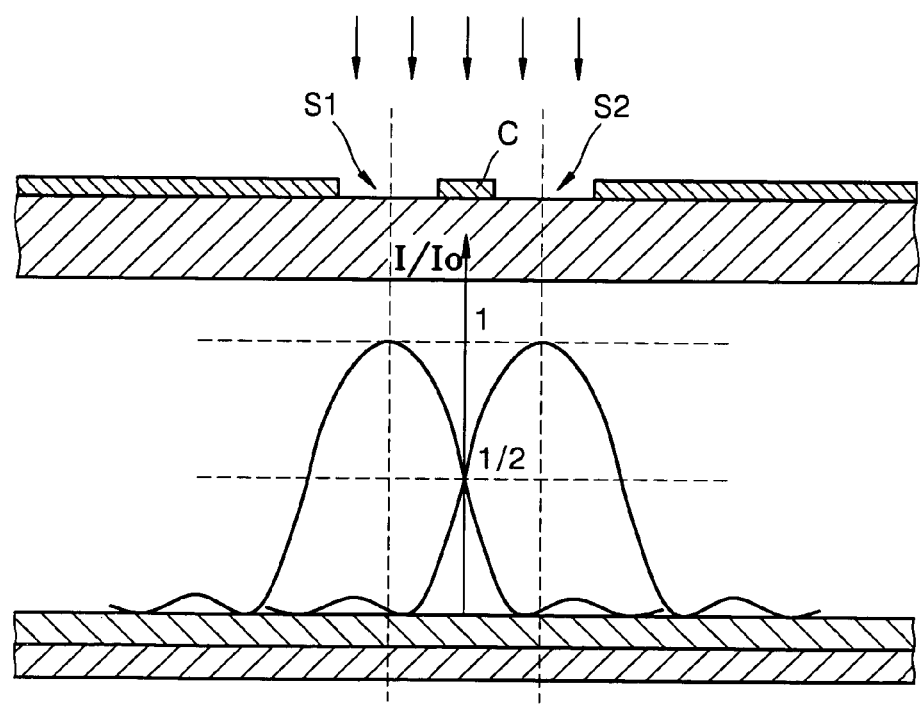

As shown in FIG. 19B, when beams of the parallel light pass through two slits S1 and S2, the beams are diffracted and interfere constructively. In this case, locations at which the beams interfere constructively vary by adjusting widths of the slits S1 and S2 and the width of the shielding portion C between the slits S1 and S2, so that the overall diffraction pattern varies. As described above, only the intensity of the maximum is taken into consideration and the second maxima, and the next higher order maxima, can be neglected.

As shown in FIG. 19B, an overlapping location of diffracted beams can be adjusted by adjusting the width of the shielding portion C between the slits S1 and S2, so that the beams overlap at a location corresponding to the intermediate intensity of the two beams, that is, $(I/I_0=\frac{1}{2})$. If the two diffracted beams overlap in such an adjustable manner, the intensity is substantially constant, thereby obtaining layers having substantially equal heights after exposure, which is based on Fraunhofer's diffraction theory using two slits.

Figure 20:
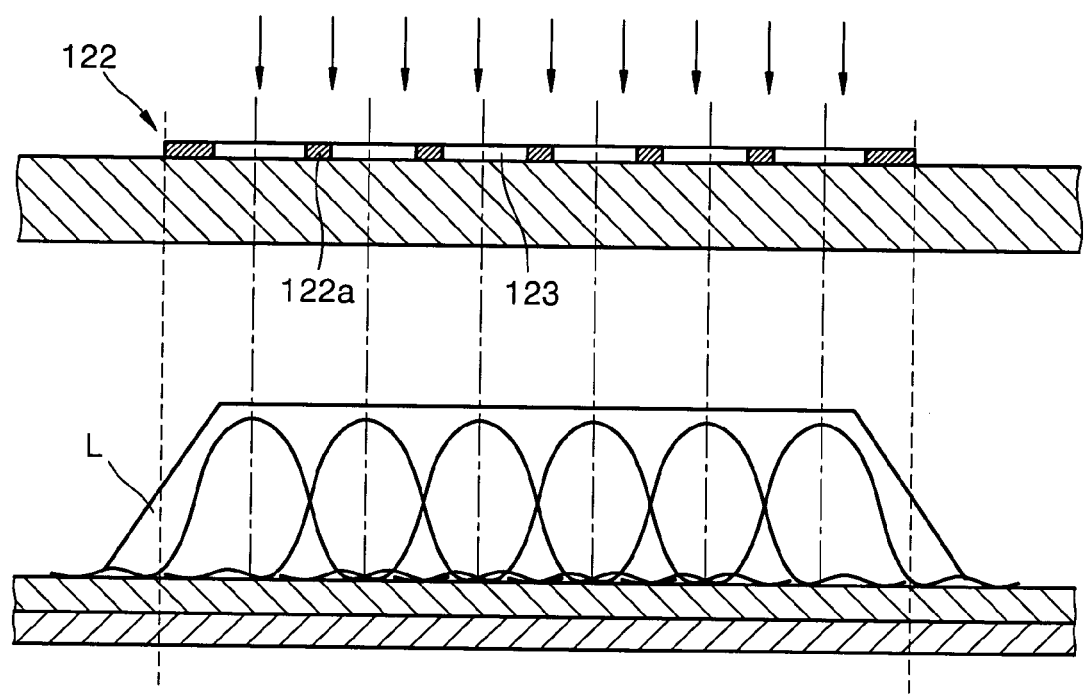

The principle can also be applied to the case of using multiple slits. For example, the principle can be applied to the mask used in the manufacturing method shown in FIG. 18. FIG. 20 shows a state of exposure by the second shielding portion 122 of the second patterning portion 120. As shown in FIG. 20, illustrating the intensity profile of diffraction patterns resulting when beams pass through the second shielding portion 122 having a plurality of auxiliary slits 123, overlapping patterns corresponding to the plurality of auxiliary slits 123 are produced. Accordingly, the value of intensity can be maintained substantially constantly within the boundary of the second shielding portion 122. Here, the beam profiles can overlap at a location corresponding to the intermediate intensity of two adjacent beams, thereby obtaining a layer having a substantially same thickness.

Thus, if the resulting mask is disposed on a photosensitive layer and light is then irradiated, a layer L can be obtained. The height of the layer L is smaller than that of a layer formed without light irradiation. This is because the intensity is weakened by diffraction while passing through the plurality of auxiliary slits 123.

Figure 21:
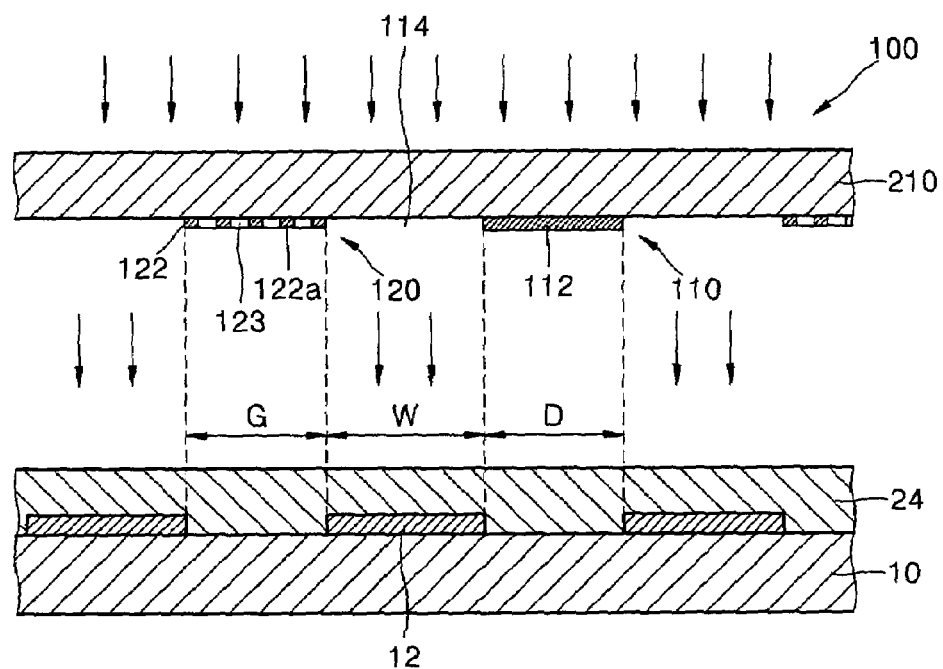
FIG. 21 illustrates a state in which a photosensitive layer is exposed according to an embodiment of the present invention.

Based on the above-described principle, the manufacturing method according to an embodiment of the present invention will now be described. As shown in FIG. 21, a photosensitive layer 24 is coated on the substrate 10 and first electrode unit 12 shown in FIGS. 16A and 16B, and exposed using a mask (200 shown in FIG. 17). FIG. 21 shows some unit masks (100 shown in FIG. 17). The photosensitive layer 24 is of a positive type in which portions exposed to light are removed. However, a negative photosensitive layer, in which portions exposed to light are not removed, may also be used. The photosensitive layer can be formed of photoresist or photosensitive polyimide. The polyimide, having good heat resistance and moisture resistance, is preferred because it allows the formed insulating layers to be dried at high temperature to remove moisture therefrom.

As shown in FIG. 21, when the photosensitive layer 24 is coated and exposure is performed using the unit mask 100, the light irradiated into the mask 100 is completely shielded through the first shielding portion 112 of the first patterning portion 110, forming a region D, and is diffracted through the auxiliary slits 123 of the second shielding portion 122 of the second patterning portion 120, forming a region G having weaker intensity. The light is transmitted through the first slit portion 114 between the first shielding portion 112 and the second shielding portion 122, forming a region W. The region W is a region where the photosensitive layer is completely removed by exposure and development and corresponds to the first electrode unit 12, the region G is a potential region to be an inter-insulator, and the region D is a potential region to be an insulating wall whose height is greater than the height of the inter-insulator, which may vary according to patterns of the inter-insulator and insulating wall. That is, the first slit portion 114 and the second slit portion 124 can be interchanged to each other.

Figure 22:
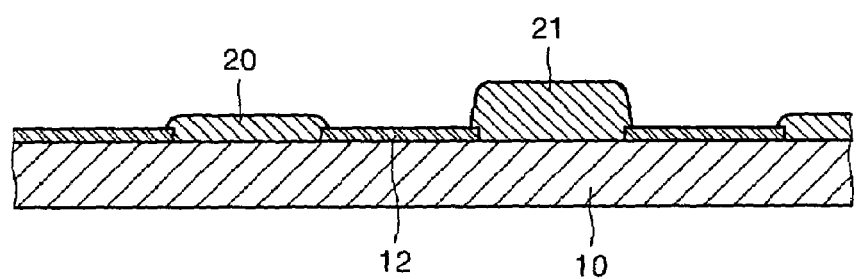
FIG. 22 is a cross-sectional view of the photosensitive layer shown in FIG. 21.

If the photosensitive layer 24 is removed by development after exposure, the inter-insulator 20 and the insulating wall 21 are formed between electrode lines of the first electrode unit 12, as shown in FIG. 22.

The invention has been described through the use of the positive photosensitive layer. In the case of using a negative photosensitive layer in which non-exposed portions are removed, a mask having a reversed structure can be used. That is, a mask opened along a pattern used in forming a layer is used, and the height of the layer is adjusted by adjusting the intensity such that an auxiliary shielding portion with auxiliary slits for light diffraction is provided at a slit portion. In other words, in the case of simultaneously forming insulating walls and inter-insulators as described above, a first patterning portion is constructed so as to have a first shielding portion opened along a pattern to be an inter-insulator, and a second patterning portion is constructed so as to have a second shielding portion opened along a pattern to be an insulating layer, wherein a plurality of auxiliary shielding portions are formed in the opened portion of the second shielding portion. Thus, the light irradiated into the second shielding portion is diffracted by auxiliary slits between the auxiliary shielding portions, so that the intensity is weakened. Accordingly, insulating layers having different heights can be easily manufactured.

After the insulating layers are formed on a substrate and a first electrode unit, organic layers are deposited on the insulating layers and a second electrode unit is formed in a predetermined pattern, followed by hermetically sealing, thereby manufacturing an organic EL device. Then, a flexible PCB having driving IC's and another PCB are mounted on the sealed device, thereby completing a module.

As described above, the present invention has the following effects.

First, insulating layers having different patterns and heights can be simultaneously formed by using a single photo mask, thereby enhancing manufacturability and processing efficiency.

Second, damage to the layer caused by the deposition mask can be prevented by forming insulating walls for protection in forming an EL layer or cathode using a deposition mask, short-circuits between first and second electrodes can be prevented, and deterioration of organic layer characteristics due to non-uniformity in the coated thickness of organic layers can be prevented.

Third, contamination of the device due to the spreading of an adhesive agent, connection inferiority between a flexible PCB and electrode terminals, and corrosion of exposed electrode terminals, can be prevented.

Fourth, moisture can be prevented from infiltrating into the device through electrode terminals, and moisture remaining in layers can be removed.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A method of manufacturing an electroluminescent display (EL) device, the method comprising:
    forming a first electrode unit arranged in a first predetermined pattern on a substrate;
    simultaneously forming two or more insulating layers, using a patterned single mask, covering the substrate and at least portions of the first electrode unit and defining a light emitting area having a second predetermined pattern, the insulating layers having different heights and patterns;
    forming an electroluminescent (EL) layer on the light-emitting area;
    forming a second electrode unit in a third predetermined pattern on the light emitting area; and
    sealing the substrate.

2. The method of claim 1, wherein the third predetermined pattern of the second electrode unit is predetermined so as to be perpendicular to the first electrode unit.

3. The method of claim 1, wherein the simultaneously forming of two or more insulating layers comprises:
    coating a photosensitive layer having a predetermined height on the substrate and the first electrode unit;
    exposing the photosensitive layer using the patterned single mask having two or more patterns corresponding to the two or more insulating layers; and
    developing the exposed photosensitive layer, wherein portions of the photosensitive layer exposed through the two or more patterns of the patterned single mask are each exposed to light with a uniform intensity across said portions.

4. The method of claim 3, wherein the patterned mask comprises two or more patterning portions transmitting different amounts of light.

5. The method of claim 3, wherein the patterned mask comprises:
    a first patterning portion shielding or transmitting a total amount of light irradiated: and
    a second patterning portion having a plurality of auxiliary slits diffracting light transmitted through the auxiliary slits.

6. The method of claim 5, wherein the auxiliary slits of the second patterning portion comprise one or more portions having different widths, and diffraction is varied by adjusting widths of the auxiliary slits.

7. The method of claim 6, wherein the insulating layers formed using the patterned mask comprise inter-insulators defining the first electrode unit into the light-emitting area having the second predetermined pattern, insulating walls having a predetermined pattern and each having a height greater than each of the inter-insulators, shielding walls formed on the substrate along an outer periphery of the light-emitting area and preventing entry or escape of an adhesive agent when sealing the substrate, a sealing portion formed along a portion of the substrate sealed and preventing infiltration of moisture when sealing the substrate, and separators defining the second electrode unit in the third predetermined pattern.

8. The method of claim 3, wherein the photosensitive layer is formed of photoresist or photosensitive polyimide.

9. A method of manufacturing an electroluminescent display (EL) device, the method comprising:
    forming a first electrode unit arranged in a first predetermined pattern on a substrate;
    simultaneously forming inter-insulators, covering the substrate and at least portions of the first electrode unit and defining a light emitting area having a second predetermined pattern, and insulating walls, having a third predetermined pattern formed on at least portions of the inter-insulators, wherein the inter-insulators and the insulating walls have different heights and are formed using a patterned single mask;
    forming an EL layer on the light-emitting area;
    forming a second electrode unit in a fourth predetermined pattern on the light emitting area; and
    sealing the substrate.

10. The method of claim 9, wherein the fourth predetermined pattern of the second electrode unit is predetermined so as to be perpendicular to the first electrode unit.

11. The method of claim 9, wherein the forming of the inter-insulators and the insulating walls comprises:
    coating a photosensitive layer having a predetermined height on the substrate and the first electrode unit;
    exposing the photosensitive layer using the patterned single mask; and
    developing the exposed photosensitive layer, wherein the patterned single mask comprises a first patterning portion and a second patterning portion respectively exposing the inter-insulators and the insulating walls.

12. The method of claim 11, wherein the first and second patterning portions transmit different amounts of light.

13. The method of claim 11, wherein the first patterning portion shields or transmits a total amount of light irradiated during the exposing, and the second patterning portion has a plurality of auxiliary slits diffracting light transmitted through the auxiliary slits.

14. The method of claim 13, wherein the photosensitive layer is of a positive type in which exposed portions thereof are removed, the first patterning portion has a first shielding portion along a pattern for forming the insulating walls, and the second patterning portion has a second shielding portion having the plurality of auxiliary slits along a pattern for forming the inter-insulators, wherein the light irradiated into the second shielding portion is diffracted through the plurality of auxiliary slits.

15. The method of claim 13, wherein the photosensitive layer is of a negative type in which non-exposed portions thereof are removed, the first patterning portion has a first shielding portion opened along a pattern for forming the insulating walls, and the second patterning portion has a second shielding portion opened along a pattern for forming the inter-insulators, wherein the opened portion of the second shielding portion has an auxiliary shielding portion having the plurality of auxiliary slits so that the light irradiated into the second shielding potion is diffracted.

* * * * *